US008629970B2

(12) United States Patent
Sewell et al.

(10) Patent No.: US 8,629,970 B2
(45) Date of Patent: Jan. 14, 2014

(54) IMMERSION LITHOGRAPHIC APPARATUS WITH IMMERSION FLUID RE-CIRCULATING SYSTEM

(75) Inventors: Harry Sewell, Ridgefield, CT (US); Erik Roelof Loopstra, Eindhoven (NL); Johannes Catharinus Hubertus Mulkens, Waalre (NL); Louis John Markoya, Sandy Hook, CT (US); Diane McCafferty, Sandy Hook, CT (US)

(73) Assignees: ASML Netherlands B.V., Veldhoven (NL); ASML Holding NV, Veldhoven (NL)

( * ) Notice: Subject to any disclaimer, the term of this patent is extended or adjusted under 35 U.S.C. 154(b) by 702 days.

(21) Appl. No.: 12/355,039

(22) Filed: Jan. 16, 2009

(65) Prior Publication Data

US 2009/0185149 A1 Jul. 23, 2009

Related U.S. Application Data

(60) Provisional application No. 61/023,052, filed on Jan. 23, 2008, provisional application No. 61/129,716, filed on Jul. 14, 2008.

(51) Int. Cl.
G03B 27/52 (2006.01)
G03B 27/32 (2006.01)

(52) U.S. Cl.
USPC .............................................. 355/30; 355/77

(58) Field of Classification Search
USPC ....................................................... 355/30, 53
See application file for complete search history.

(56) References Cited

U.S. PATENT DOCUMENTS

| 4,509,852 | A | 4/1985 | Tabarelli et al. |
| 6,952,253 | B2 | 10/2005 | Lof et al. |
| 7,065,427 | B1 * | 6/2006 | Dakshina-Murthy et al. ............... 700/120 |
| 7,213,963 | B2 * | 5/2007 | Lof et al. ........................ 366/53 |
| 7,224,434 | B2 * | 5/2007 | Tokita .............................. 355/53 |

(Continued)

FOREIGN PATENT DOCUMENTS

EP 1420298 A2 5/2004
JP 11216303 A * 8/1999

(Continued)

OTHER PUBLICATIONS (http://web.archive.org/web/20070907140959/http://www.kiwipumps.com/bladder-pumps.html.*

(Continued)

*Primary Examiner* — Peter B Kim
*Assistant Examiner* — Michelle Iacoletti
(74) *Attorney, Agent, or Firm* — Pillsbury Winthrop Shaw Pittman LLP

(57) ABSTRACT

A lithographic apparatus includes a projection system, a fluid handling structure, a metrology device, and a recycling control device. The projection system is configured to project a patterned radiation beam onto a target portion of a substrate, the substrate being supported on a substrate table. The fluid handling structure is configured to provide an immersion fluid to a space between the projection system and the substrate and/or substrate table. The metrology device is configured to monitor a parameter of the immersion fluid. The recycling control device regulates a routing of the immersion fluid either to be reused by the fluid handling structure or to be reconditioned based on the quality of immersion fluid indicated by the metrology device.

28 Claims, 8 Drawing Sheets

(56) References Cited

U.S. PATENT DOCUMENTS

| | | | |
|---|---|---|---|
| 7,435,528 B2* | 10/2008 | Peng et al. | 430/270.1 |
| 7,550,075 B2* | 6/2009 | Bertram et al. | 210/96.1 |
| 7,714,980 B2 | 5/2010 | Sakai | |
| 2005/0074704 A1* | 4/2005 | Endo et al. | 430/322 |
| 2005/0078286 A1 | 4/2005 | Dierichs et al. | |
| 2005/0146695 A1* | 7/2005 | Kawakami | 355/30 |
| 2005/0270505 A1* | 12/2005 | Smith | 355/53 |
| 2006/0082746 A1* | 4/2006 | Mertens et al. | 355/53 |
| 2007/0131604 A1* | 6/2007 | Nomura | 210/321.69 |
| 2007/0164261 A1* | 7/2007 | Miyamatsu et al. | 252/582 |
| 2007/0188725 A1* | 8/2007 | Sakai | 355/53 |
| 2008/0062393 A1 | 3/2008 | Hubertus Mulkens | |
| 2008/0129970 A1 | 6/2008 | Furukawa et al. | |
| 2009/0061331 A1* | 3/2009 | Nakano | 430/30 |
| 2009/0213342 A1 | 8/2009 | Weippert et al. | |

FOREIGN PATENT DOCUMENTS

| | | |
|---|---|---|
| JP | 2005-136374 | 5/2005 |
| JP | 2006-222186 | 8/2006 |
| JP | 2007-234821 | 9/2007 |
| JP | 2008004928 A * | 1/2008 |
| JP | 2008-066726 | 3/2008 |
| JP | 2008-517473 T | 5/2008 |
| JP | 2008-182167 | 8/2008 |
| WO | 99/49504 A1 | 9/1999 |
| WO | 2006/045748 | 5/2006 |
| WO | 2006/080250 | 8/2006 |
| WO | 2007/029829 | 3/2007 |

OTHER PUBLICATIONS

Japanese Office Action mailed May 30, 2011 in corresponding Japanese Patent Application No. 2009-007808.

* cited by examiner

IMMERSION LITHOGRAPHIC APPARATUS WITH IMMERSION FLUID RE-CIRCULATING SYSTEM

This application claims priority and benefit under 35 U.S.C. §119(e) to U.S. Provisional Patent Application Ser. No. 61/023,052, entitled "An Immersion Lithography Apparatus", filed on Jan. 23, 2008, and to U.S. Provisional Patent Application Ser. No. 61/129,716, entitled "Immersion Lithographic Apparatus With Immersion Liquid Re-Circulating System", filed on Jul. 14, 2008. The contents of those applications are incorporated herein in their entirety by reference.

FIELD

The present invention relates to an immersion lithographic apparatus and method of re-circulating an immersion fluid in the immersion lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging the pattern using an ultraviolet (UV) radiation beam onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a fluid having a relatively high refractive index, e.g., water or a hydrocarbon liquid, so as to fill a space between the final element of the projection system and the substrate. The fluid may be distilled water, although another fluid could be used. The description herein references a liquid. However, another fluid may be suitable, for example, a wetting fluid, an incompressible fluid, and/or a fluid with a higher refractive index than air and desirably a higher refractive index than water. Immersing the substrate into such a liquid enables imaging of smaller features, since the exposure radiation will have a shorter wavelength in the liquid (the effect of the liquid may be regarded as increasing the effective numerical aperture (NA) of the system and increasing the depth of focus). Organic fluids are one of the liquids being considered for use in immersion lithography. These organic fluids have a higher refractive index than water and can include hydrocarbons, such as decahydronaphthalene (also known as decalin), a fluorohydrocarbon, and a cubane dispersed in an organic solvent. Other proposed immersion liquids include, but are not limited to, water with solid particles (e.g., quartz) suspended therein.

Submersing the substrate or substrate and substrate table in a bath of liquid means that there is a large body of liquid that must be accelerated during a scanning exposure. This requires additional or more powerful motors, and the resulting turbulence in the liquid may lead to undesirable and unpredictable effects.

One of the solutions proposed is for a liquid supply system to provide liquid on only a localized area of the substrate and in between the final element of the projection system and the substrate using a liquid confinement system (the substrate generally has a larger surface area than the final element of the projection system).

SUMMARY

In existing immersion lithographic systems, water is used as the immersion fluid. After the high purity water passes through an immersion liquid system and has been in contact with the substrate being printed, the water is disposed of as waste. New high refractive index fluids are being investigated as a future replacement for water as the immersion fluid. These new high refractive index fluids will allow the numerical aperture of the optics to be increased beyond 1.35. However, the new fluids, which may replace water, are expensive and are potentially environmental hazards.

It is desirable, for example, to recondition an immersion fluid that fails to meet a certain quality threshold, and then re-circulate the reconditioned immersion fluid. Further, it is desirable to provide a fluid handling and re-circulating system whose components do not contribute to the degradation of the immersion fluid.

In an embodiment, a lithographic apparatus for immersion lithography includes a projection system configured to project a patterned radiation beam onto a target portion of a substrate, the substrate being supported on a substrate table. The lithographic apparatus includes a liquid handling system having a liquid handling structure configured to provide an immersion liquid to a space between the projection system and the substrate and/or the substrate table. A metrology device of the lithographic apparatus is configured to monitor a parameter of the immersion liquid, and a recycling control device, coupled to the metrology device, is configured to regulate a routing of the immersion liquid either to be reused or to be reconditioned. In one example, components of the liquid handling structure are manufactured and operated in a way that does not degrade the quality of the immersion liquid.

In an embodiment, a liquid handling system for use in a lithographic apparatus includes a metrology device configured to monitor a parameter of an immersion liquid, wherein a quality of the immersion liquid is determined before directing the immersion liquid to a liquid handling structure of the lithographic apparatus. A recycling control device, coupled to the metrology device, is configured to regulate a routing of immersion liquid from the liquid handling structure after use to a regular or an intense liquid reconditioning unit, based on the determined quality of the immersion liquid.

In an embodiment, a control system for maintaining a desired quality of an immersion liquid in a lithographic apparatus includes a sensor. The sensor includes an absorption sensor configured to measure an index of absorption of radiation at a desired wavelength of the immersion liquid; and/or a refractive index sensor configured measure a refractive index of immersion liquid; and/or a surface tension sensor configured to measure a surface tension of immersion liquid; and/or a rheology sensor configured to measure a viscosity of immersion liquid; and/or a temperature sensor. A controller is configured to receive data from the sensor(s) and to determine, based on the received data, whether the immersion liquid should be directed to a liquid handling structure of the lithographic apparatus or to a liquid reconditioning system.

In an embodiment, a device manufacturing method provides an immersion liquid via a liquid handling structure to an area between a projection system and a substrate and/or a substrate table, allowing the projection system to have a high numerical aperture. A parameter of the immersion liquid is monitored. A routing of the immersion liquid is regulated either to be used by the liquid handling structure or to be reconditioned based on the monitoring of the parameter of the immersion liquid.

Further embodiments, features, and advantages of the present inventions, as well as the structure and operation of the various embodiments of the present invention, are described in detail below with reference to the accompanying drawings.

BRIEF DESCRIPTION OF THE DRAWINGS

The accompanying drawings, which are incorporated herein and form a part of the specification, illustrate one or more embodiments of the present invention and, together with the description, further serve to explain the principles of the invention and to enable a person skilled in the pertinent art to make and use the invention.

One or more embodiments of the present invention will now be described with reference to the accompanying drawings.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described can include a particular feature, structure, or characteristic, but every embodiment cannot or do not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention can be implemented in hardware, firmware, software, or any combination thereof. Embodiments of the invention can be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions, etc. can be described herein as performing certain actions. However, it should be appreciated that such descriptions are merely for convenience and that such actions in fact result from computing devices, processors, controllers, or other devices executing the firmware, software, routines, instructions, etc.

Figure 1:
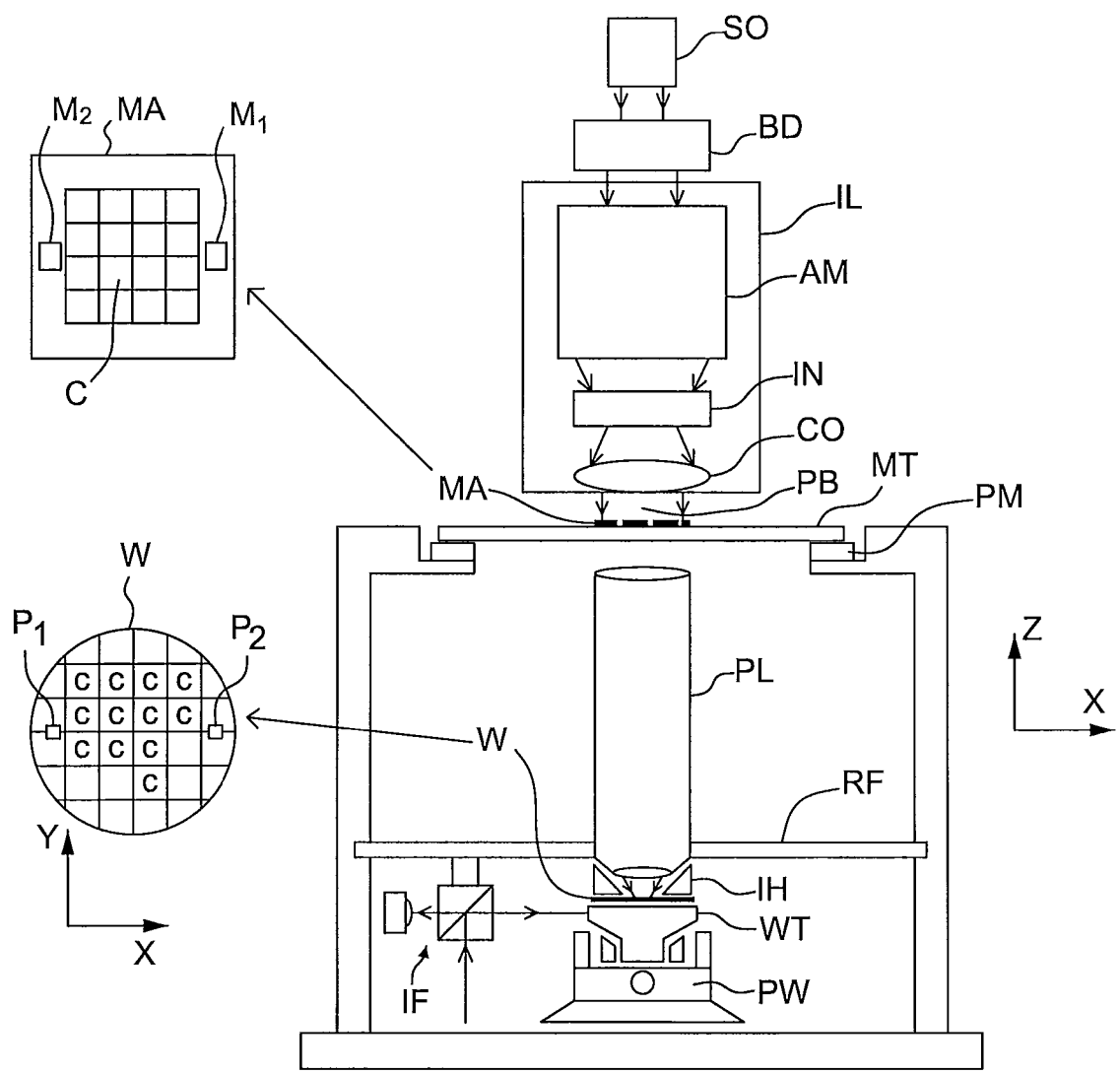
FIG. 1 depicts an exemplary lithographic apparatus, according to an embodiment of the invention.

FIG. 1 schematically depicts a lithographic apparatus, according to an embodiment of the present invention. The apparatus comprises an illumination system (illuminator) IL configured to condition a radiation beam B (e.g., UV radiation or deep ultraviolet (DUV) radiation); a support structure MT (e.g., a mask table) constructed to support a patterning device MA (e.g., a mask) and connected to a first positioner PM configured to accurately position the patterning device in accordance with certain parameters; a substrate table WT (e.g. a wafer table) constructed to hold a substrate W (e.g. a resist coated wafer) and connected to a second positioner PW configured to accurately position the substrate in accordance with certain parameters; and a projection system PS (e.g., a refractive projection lens system) configured to project a pattern imparted to the radiation beam B by patterning device MA onto a target portion C (e.g. comprising one or more dies) of substrate W.

The illumination system can include various types of optical components, such as refractive, reflective, magnetic, electromagnetic, electrostatic or other types of optical components, or any combination thereof, for directing, shaping, or controlling radiation.

The support structure MT holds the patterning device. The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example, with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example, if the pattern includes phase-shifting features or so-called assist features. Generally, the pattern imparted to the radiation beam will correspond to a particular functional layer in a device being created in the target portion, such as an integrated circuit.

The patterning device may be transmissive or reflective. Examples of patterning devices include, but are not limited to, masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. In such an embodiment, the tilted mirrors impart a pattern in a radiation beam that is reflected by the mirror matrix.

The term "projection system" used herein should be broadly interpreted as encompassing any type of projection system, including interferometric, refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As here depicted, the apparatus is of a transmissive type (e.g. employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more patterning device tables). In such "multiple stage" machines, the additional tables may be used in parallel, or preparatory steps may be carried out on one or more tables while one or more other tables are being used for exposure.

The lithographic apparatus may be of a type wherein at least a portion of the substrate is covered by a liquid having a relatively high refractive index so as to fill a space between the projection system and the substrate. An immersion liquid may be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, illuminator IL receives a radiation beam from a radiation source SO. The source and the lithographic apparatus may be separate entities, for example, when the source is an excimer laser. In such cases, the source is not considered to form part of the lithographic apparatus and the radiation beam is passed from source SO to illuminator IL with the aid of a beam delivery system BD, which includes, for example, suitable directing mirrors and/or a beam expander. In additional embodiments, the source may be an integral part of the lithographic apparatus, for example when the source is a mercury lamp. Source SO and illuminator IL, together with beam delivery system BD if required, may be referred to as a "radiation system."

Illuminator IL may comprise an adjuster AD for adjusting the angular intensity distribution of the radiation beam. Generally, at least the outer and/or inner radial extent (commonly referred to as $\sigma_{outer}$ and $\sigma_{inner}$, respectively) of the intensity distribution in a pupil plane of the illuminator can be adjusted. In addition, illuminator IL may comprise various other components, such as an integrator IN and a condenser CO. The illuminator may be used to condition the radiation beam to have a desired uniformity and intensity distribution in its cross section.

Radiation beam B is incident on the patterning device (e.g., mask) MA, which is held on the support structure (e.g., mask table) MT, and is patterned by the patterning device. Having traversed patterning device MA, radiation beam B passes through projection system PS, which focuses the beam onto a target portion C of substrate W. With the aid of second positioner PW and position sensor IF (e.g., an interferometric device, linear encoder or capacitive sensor), substrate table WT can be moved accurately, e.g. so as to position different target portions C in the path of radiation beam B. Similarly, first positioner PM and another position sensor (which is not explicitly depicted in FIG. 1) can be used to accurately position patterning device MA with respect to the path of radiation beam B, e.g. after mechanical retrieval from a mask library, or during a scan.

In general, movement of support structure MT may be realized with the aid of a long-stroke module (coarse positioning) and a short-stroke module (fine positioning), which form part of first positioner PM. Similarly, movement of substrate table WT may be realized using a long-stroke module and a short-stroke module, which form part of second positioner PW. In the case of a stepper (as opposed to a scanner), support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on patterning device MA, the patterning device alignment marks may be located between the dies.

The depicted apparatus could be used in at least one of the following modes:

1. In step mode, support structure MT and substrate table WT are kept essentially stationary, while an entire pattern imparted to the radiation beam is projected onto a target portion C at one time (i.e., a single static exposure). Substrate table WT is then shifted in the X and/or Y direction so that a different target portion C can be exposed. In step mode, the maximum size of the exposure field limits the size of target portion C imaged in a single static exposure.

2. In scan mode, support structure MT and substrate table WT are scanned synchronously while a pattern imparted to the radiation beam is projected onto a target portion C (i.e., a single dynamic exposure). The velocity and direction of substrate table WT relative to support structure MT may be determined by the (de-)magnification and image reversal characteristics of projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, support structure MT is kept essentially stationary holding a programmable patterning device, and substrate table WT is moved or scanned while a pattern imparted to the radiation beam is projected onto a target portion C. In this mode, generally a pulsed radiation source is employed and the programmable patterning device is updated as required after each movement of substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may be employed.

Figure 2:
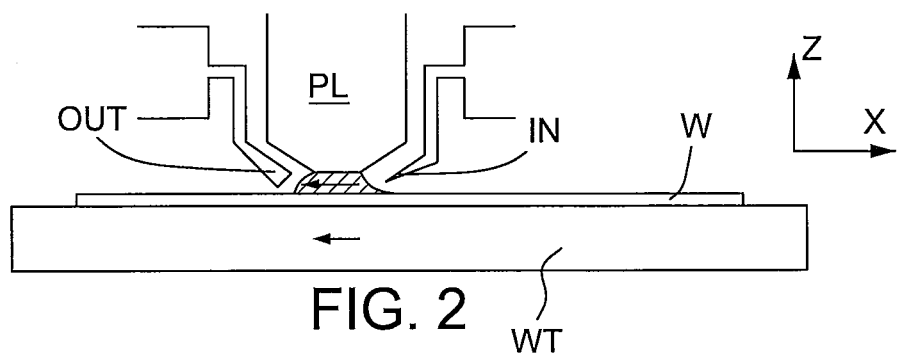
FIGS. 2 and 3 depict an exemplary liquid supply system for use in a lithographic projection apparatus, according to an embodiment of the present invention.
Figure 3:
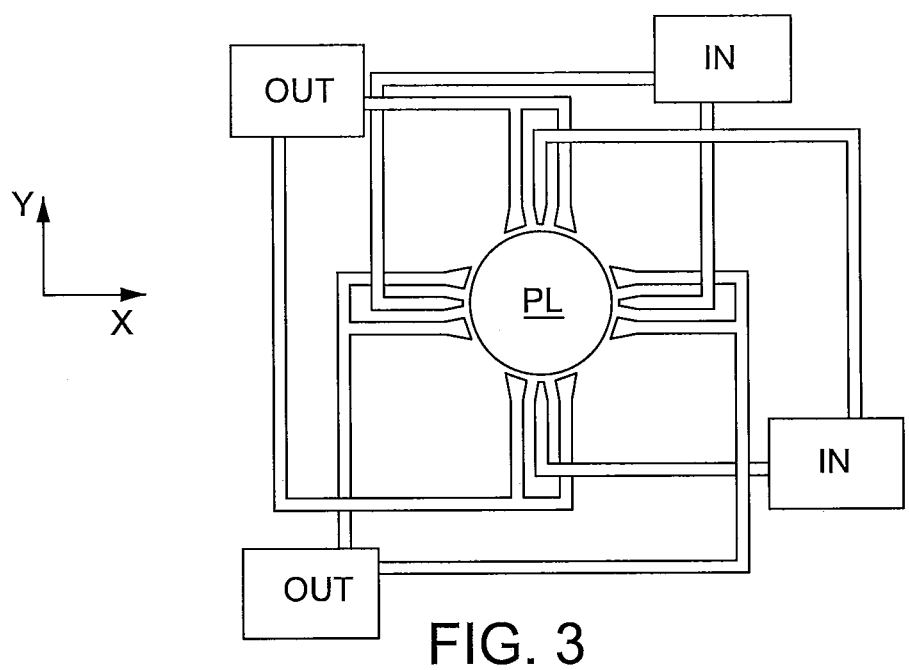

FIGS. 2 and 3 schematically depict an exemplary liquid supply system for use in lithographic projection apparatus, according to an embodiment of the present invention. In FIGS. 2 and 3, a liquid is supplied by at least one inlet IN onto the substrate and is removed by at least one outlet OUT after having passed under projection system PL. In an embodiment, inlet IN supplies liquid onto the substrate along a direction of movement of the substrate relative to the final element. As such, as the substrate is scanned beneath the element in a −X direction, liquid is supplied at the +X side of the element and taken up at the −X side. FIG. 2 schematically depicts an embodiment in which liquid is supplied via inlet IN and is taken up on the other side of the element by outlet OUT, which is connected to a low pressure source. In FIG. 2, liquid is supplied along the direction of movement of the substrate relative to the final element. However, the present invention is not limited to liquid supplied in such directions, and in additional embodiments, various numbers of inlets IN and outlets OUT can be configured about the final element without departing from the spirit or scope of the present invention. For example, and as depicted in FIG. 3, four sets of inlets IN with outlets OUT on either side are provided in a regular pattern around the final element.

Figure 4:
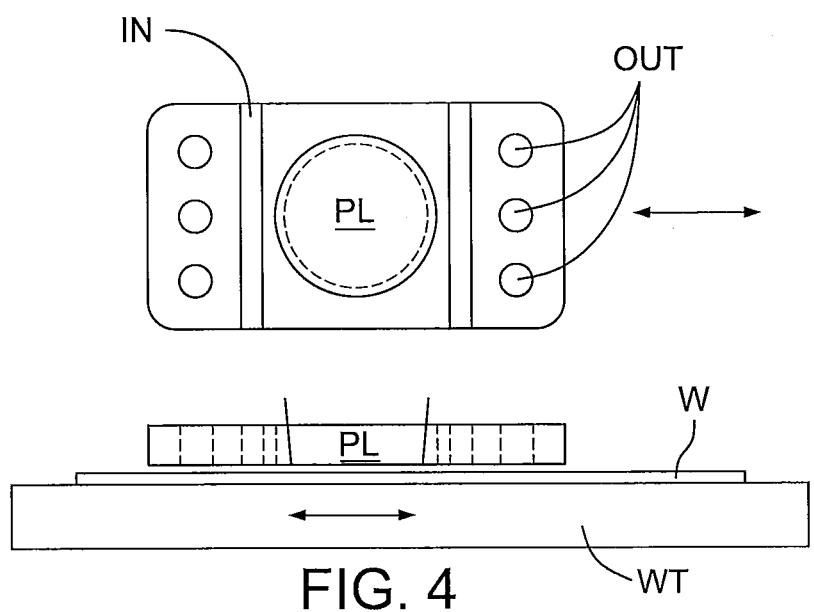
FIG. 4 depicts an exemplary liquid supply system for use in a lithographic projection apparatus, according to an embodiment of the present invention.

FIG. 4 schematically depicts an exemplary liquid supply system for use in a lithographic projection apparatus, according to an embodiment of the present invention. A liquid is supplied by two groove inlets IN on either side of the projection system PL and is removed by a plurality of discrete outlets OUT, arranged radially outwardly of the inlets IN. In the embodiment of FIG. 4, inlets IN and outlets OUT are arranged within a plate having a hole through which a beam of radiation is projected. Liquid is supplied by one groove inlet IN on one side of the projection system PL and is removed by a plurality of discrete outlets OUT on the other side of the projection system PL, thereby causing a flow of a thin film of liquid between the projection system PL and the projection system PL. The choice of a combination of inlet IN and outlets OUT incorporated within the liquid supply system can depend on the direction of movement of the substrate W (the other combination of inlet IN and outlets OUT being inactive).

Figure 5:
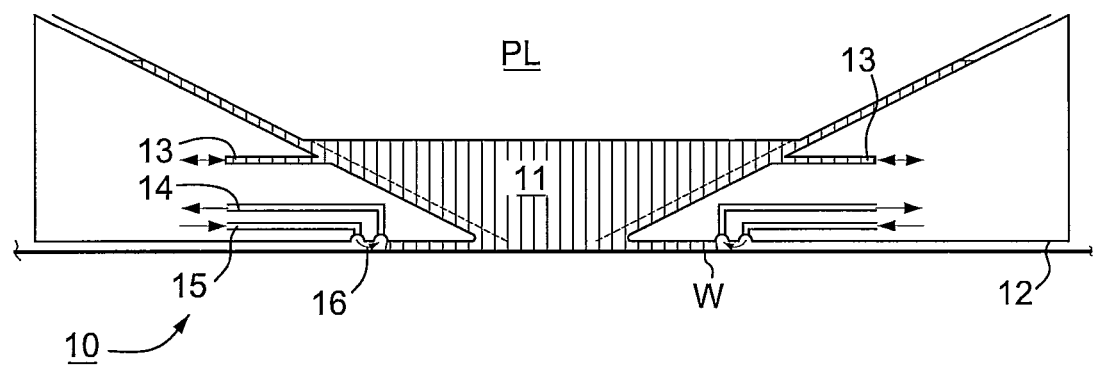
FIG. 5 depicts an exemplary liquid supply system for use in a lithographic projection apparatus, according to an embodiment of the present invention.

FIG. 5 schematically depicts a liquid supply system for use in a lithographic projection apparatus, according to an embodiment of the present invention. In the embodiment of FIG. 5, the liquid supply system includes a barrier member (or so-called "immersion hood") that extends along at least a part of a boundary of the space between the final element of the projection system and the substrate table. The barrier member can be substantially stationary relative to the projection system in the XY plane, although though there may be some relative movement in the Z direction (e.g., the direction of the optical axis).

Referring to FIG. 5, a barrier member 12 forms a contactless seal between the barrier member and the surface of the substrate around the image field of the projection system. As such, liquid is confined to a reservoir or an immersion space 11 between the substrate surface and the final element of the projection system. Reservoir 11 is formed by barrier member 12 positioned below and surrounding the final element of the projection system PL. Liquid is brought into the space below the projection system and within barrier member 12 by, for example, opening 13. In FIG. 5, a portion of barrier member 12 extends above the final element of the projection system, and the liquid rises above the final element so that a buffer of liquid is provided. Barrier member 12 has an inner periphery that, at an upper end, can closely conform to the shape of the projection system or the final element thereof, e.g., the upper end may be round. At its bottom, a lower end of the inner periphery closely conforms to the shape of the image field, e.g., the lower end may be rectangular. However, in additional embodiments, such conformity need not exist.

The liquid is confined in the reservoir by a gas seal 16 between the bottom of barrier member 12 and the surface of the substrate W. In an embodiment, gas seal 16 can be formed using a gas, including, but not limited to air, synthetic air, nitrogen ($N_2$), or other inert gas. The gas can be provided under pressure through an inlet 15 to the gap between barrier member 12 and the substrate and can be extracted through outlet 14. Overpressure on gas inlet 15, vacuum level on outlet 14, and a geometry of the gap cam be configured so that there is a high-velocity gas flow inwards that confines the liquid. An exemplary system is disclosed in U.S. Pat. No. 6,952,253, which is incorporated herein by reference in its entirety.

In additional embodiments, liquid supply systems, such as that depicted in FIG. 5, are not limited to a gas seal, such as gas seal 16. For example, gas seal 16 can be replaced by a single phase extractor, which is configured to only extract liquid. Further, one or more additional modules configured to produce a gas flow may be positioned radially outwardly of the single phase extractor to help contain the liquid in the space. For example, one such module is a so-called "gas knife," in which a thin jet of gas is directed downwards onto the substrate W. Further, during scanning motion of the substrate under the projection system and the liquid supply system, hydrostatic and hydrodynamic forces may be generated that result in pressures on the liquid downwards towards the substrate.

With a localized area liquid supply system, substrate W is moved under projection system PL and the liquid supply system. The relative movement of the table may enable an edge of the substrate W to be imaged or a sensor on the substrate table to be imaged for sensing purposes, or for substrate swap (e.g., removal and replacement of substrate W from substrate table WT between exposures of different substrates). Further, during substrate swap, it may be desirable for liquid to be kept within liquid confinement system 12. In such an embodiment, confinement can achieved by moving liquid confinement system 12 relative to substrate table WT, or vice versa, so that the liquid confinement system is placed over a surface of substrate table WT away from substrate W, such as a shutter member. As such, immersion liquid may be retained in the liquid confinement system by operating the gas seal 16 or by clamping the surface of the shutter member to the undersurface of liquid confinement system 12. The clamping may be achieved by controlling the flow and/or pressure of fluid provided to the undersurface of liquid confinement system 12. For example, the pressure of gas supplied from the inlet 15 and/or the under pressure exerted from the outlet 14 may be controlled.

The surface of substrate table over WT which the liquid confinement system 12 is placed may be an integral part of the substrate table 12, or alternatively, the surface may be a detachable and or replaceable component of the substrate table 12. Such a detachable component may be referred to as a closing disc or a dummy substrate. Further, the detachable or separable component may be a separate stage. In a dual- or multi-stage arrangement, the entire substrate table 12 is replaced during substrate exchange. In such an arrangement, the detachable component may be transferred between substrate tables. The shutter member may be an intermediate table that may be moved adjacent to the substrate table WT prior to substrate exchange. The liquid confinement system may then be moved onto the intermediate table, or vice versa, during substrate exchange. The shutter member may be a moveable component of the substrate table, such as a retractable bridge, that may be positioned between the stages during substrate exchange. Further, the surface of the shutter member may be moved under the liquid confinement structure, or vice versa, during substrate exchange.

During substrate swap, an edge of the substrate W will pass under the space 11, and liquid may leak into the gap between the substrate W and substrate table WT. This liquid may be forced in under hydrostatic or hydrodynamic pressure, or by a force of a gas knife or other gas-flow-creating device. A drain may be provided around the edge of a substrate W, such as in the gap, and additionally or alternatively, a drain may be located around another object on the substrate table. Such objects may include, but are not limited to, one or more sensors and/or a shutter member used to maintain liquid in the liquid supply system by being attached to the bottom of the liquid supply system during, for example, the substrate swap. Thus, any reference to the substrate W should be considered to be synonymous with any such other object, including a sensor or shutter member, such as a closing plate.

For other exemplary lithographic systems, see generally U.S. Pat. No. 4,509,852, PCT Patent Application Publication No. WO 99/49504, and European Patent Application Publication No. EP-A-1,420,298, which are all incorporated by reference herein in their entireties. For exemplary recycling systems for immersion lithography systems, see generally U.S. Patent Application Publication Nos. US 2005-0078286 and US 2008-0062393, which are both incorporated by reference herein in their entireties.

Exemplary embodiments of the present invention are described in relation to a lithographic apparatus having an immersion system with a liquid handling structure and drain as described in the aforementioned figures. However, it will be apparent that the embodiments can be applied to any sort of immersion apparatus. In particular, the embodiments described herein are applicable to any immersion lithographic apparatus in which defectivity, e.g., defect count density, is a problem that is reduced optimally and desirably minimized. Further, such embodiments may apply to other features of the immersion system which include, but are not limited to, cleaning systems and cleaning tools for in-line and off-line implementations; immersion liquid supply and immersion liquid retrieval systems; and gas supply and removal systems (e.g., a vacuum pump). The embodiments will be described below in relation to an immersion system that supplies an immersion liquid. However, the embodiments are equally applicable for use with an immersion system that uses a fluid supply system supplying a fluid other than a liquid as the immersion medium.

In an immersion apparatus, immersion fluid flow can be controlled by a fluid handling structure. In an embodiment, the fluid handling system may supply immersion fluid and therefore be a fluid supply system. The fluid handling structure may confine fluid and thereby may be a fluid confinement system. In an embodiment the fluid handling structure may provide a barrier to fluid and thereby be a barrier member. Further, the fluid handling system may create or use a flow of fluid (such as gas), for example, to help in controlling the flow of immersion fluid. In an embodiment, immersion liquid may be used as the immersion fluid. In that case, the fluid handling structure may be a liquid handling structure. While the embodiments hereafter are described in terms of liquid, another fluid may be processed as discussed.

Figure 6:
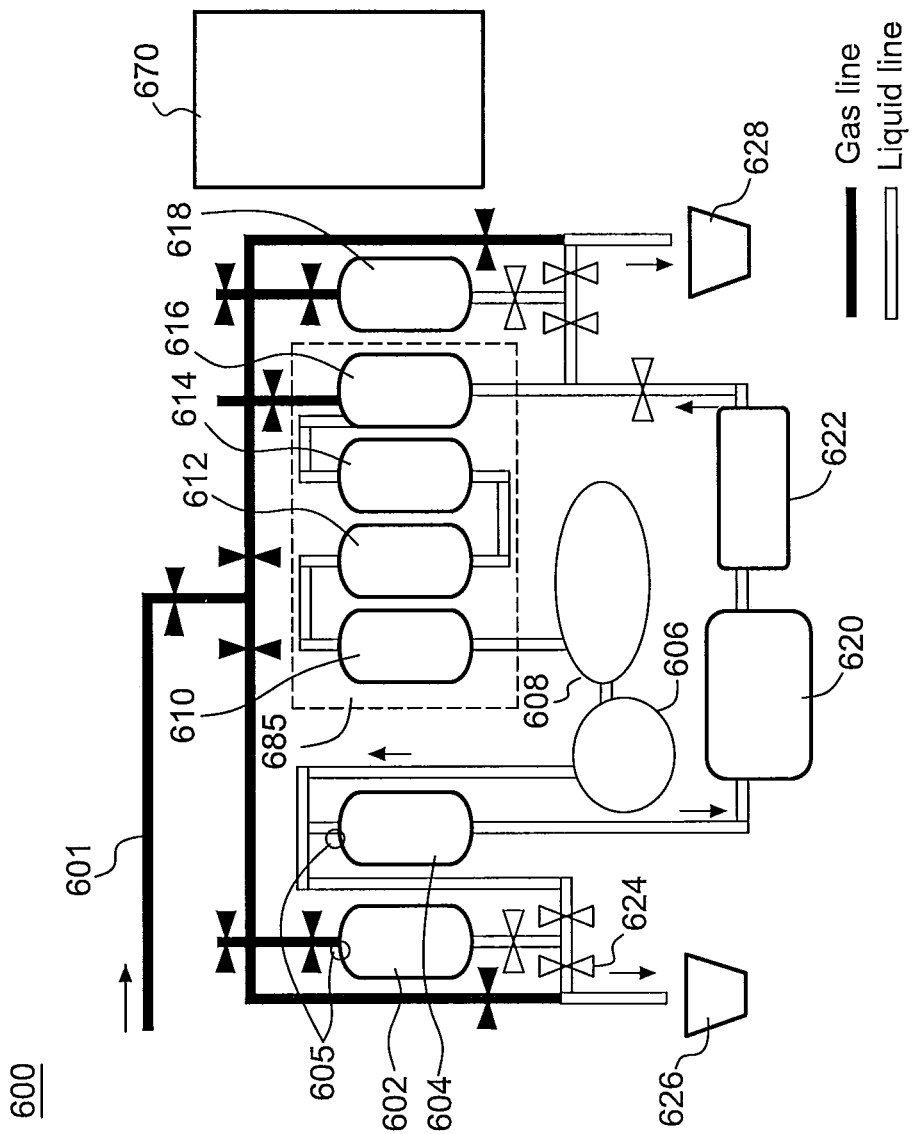
FIG. 6 depicts an exemplary immersion liquid handling structure, according to an embodiment of the present invention.

FIG. 6 depicts an exemplary immersion liquid handling structure that includes a liquid recycling system 600, according to an embodiment of the present invention. In an embodiment, system 600 may be a re-circulating liquid handling structure within an immersion lithographic system, which captures immersion liquid and recycles it. For example, system 600 may be used to capture and recycle a high-refractive-index immersion liquid, such as those discussed above (for example, a hydrocarbon, such as decalin). When processing decalin, system 600 will operate differently, as compared to systems that recycle an ultra-pure water immersion liquid. In such an embodiment, system 600 may incorporate measures against electrostatic discharge (ESD), e.g., grounding. Further, system 600 may be used to capture/process an inert gas, such as nitrogen ($N_2$).

System 600 includes an immersion liquid flow path and a gas flow path, respectively shown in grey and black in FIG. 6. Since oxygen may degrade some organic fluids used as an immersion liquid, system 600 implements a method to sparge the immersion liquid, i.e., bubbling a gas (including, but not limited to, nitrogen ($N_2$), helium (He), hydrogen, ($H_2$) or other gas) through the immersion liquid such that oxygen is driven out of the immersion liquid. Sparging helps ensure that the immersion liquid exhibits a desired low absorbency at a radiation wavelength of interest. A gas inlet 601 routes a gas used for sparging to one or more components located along the immersion liquid flow path. For example, the gas is routed to the sparger 616 and may optionally be routed to input storage (IT) 602 and/or output storage (OT) 618 to fill excess space not occupied by immersion liquid with the gas. Further or alternatively, the gas may be routed to other parts of the system 600 to flush out connecting tubing, such as at receptacle 626 and/or receptacle 628.

Examples of such components along the immersion liquid flow path of system 600 include, but are not limited to, an input storage 602 (e.g., an input tank) and an optional buffer storage (BR) 604 (e.g., a buffer reservoir) for the immersion liquid, a pump 620, a safety controller 622, a sparger (S) 616, a degasser (D) 614, a temperature controller (TC) 612, a filter (F) 610, an absorption meter 608, a flow cell 606, an output storage 618, recycled immersion liquid receptacles 626 and 628, and/or valves 624.

In an embodiment, input storage 602, e.g. a holding tank, can be a main source of immersion liquid supply. In a system with buffer storage 604 locally integrated to the lithographic apparatus, input storage 602 may physically reside away from the lithographic apparatus. Further, each of input storage 602 and the buffer storage 604 may include a liquid level sensor 605, coupled to a control system 670 (described hereafter). Input storage 602 and buffer storage 604 may be made from Teflon, ceramic, stainless steel, or any combination of these materials. In an embodiment, one, or both, of input storage 602 and buffer storage 604 may be a bladder type tank. Such a bladder tank may be made of Teflon or other suitable material. Further, one, or both, of input storage 602 and buffer storage 604 may include a sparger (such as a sparger 616, discussed below) incorporated therein as part of the design.

System 600 further includes one or more metrology components. In the embodiment of FIG. 6, such components include a flow cell 606 (which may be associated with a corresponding liquid handling structure for the immersion system) and an absorption meter 608. In additional embodiments, other metrology components may be included in a re-circulating system, as discussed below with reference to FIG. 7, without departing from the spirit and scope of the present invention.

System 600 further includes components for reconditioning the immersion liquid. In the embodiment of FIG. 6, a filter 610 (e.g., a particle filter), a temperature controller 612, a degasser 614, and a sparger 616. In an embodiment, filter 610, temperature controller 612, degasser 614, and sparger 616 may be included within a single reconditioning unit 685, as indicated by dashed lines in FIG. 6.

Figure 7:
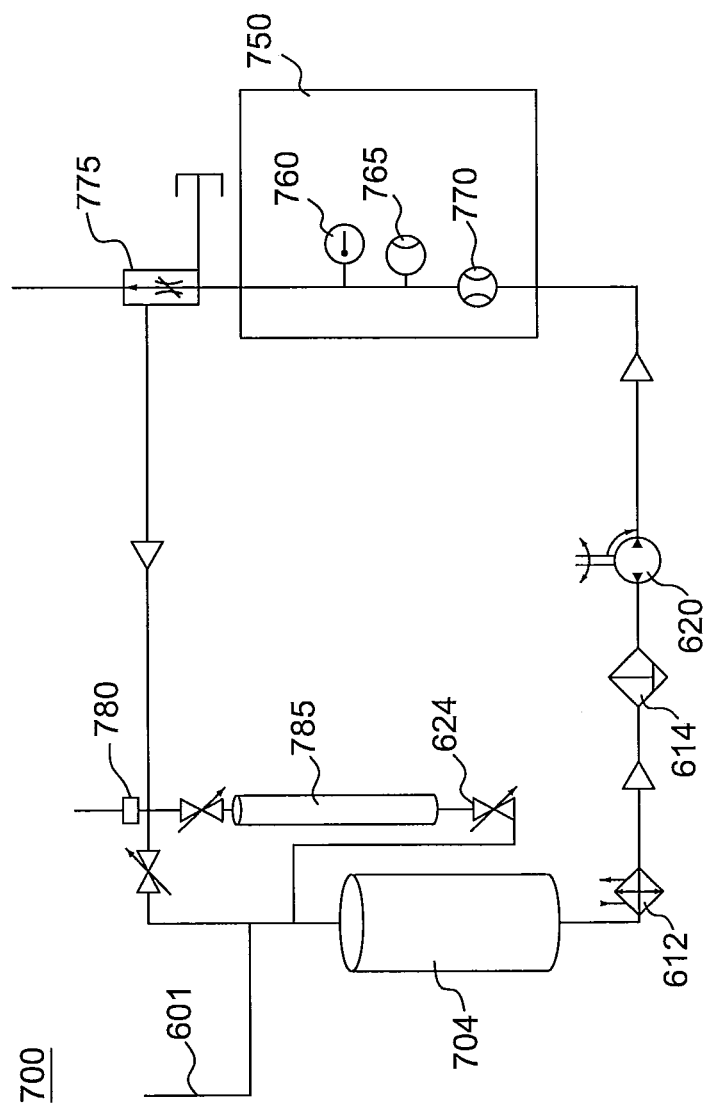
FIG. 7 depicts an exemplary immersion liquid handling structure with a metrology device and recycling logic module, according to an embodiment of the present invention.

Further, one skilled in the art would recognize that a location of reconditioning unit 685 is not limited to that depicted in FIG. 6. For example, unit 685 (or the individual reconditioning components within unit 685) may be positioned along the immersion liquid flow path before the immersion liquid goes into the liquid handling structure (as shown in FIG. 6), and/or, after the immersion liquid comes out of the liquid handling structure (as shown in FIG. 7, location of component 785 similar to component 685). In an embodiment, system 600 can include two or more reconditioning units 685 respectively positioned along the immersion liquid flow path. In such an embodiment, each reconditioning unit 685 may not include a full set of the individual reconditioning components described above. Additionally, the sequence of individual reconditioning components within a unit 685 is not limited to the sequence depicted in FIG. 6. For example, in an embodiment, temperature controller 612 may precede sparger 616 and/or, follow filter 610.

In an embodiment, filter 610 (e.g., a particle filter) contains no components or residue (for example, a finger print) that may chemically interact with the immersion liquid and create residues, contaminants, and/or deposits that would impede the performance of filter 610, the immersion system, and the exposure process. As such, contaminating residues should be avoided by not only the materials used, but by the method of manufacture. For example, an organic-based glue should be avoided in the construction of, e.g. the filter 610. Suitable materials for filter 610 include but are not limited to, Teflon and Teflon-based materials, stainless steel (which may be sintered), and sintered nickel. In an embodiment, pores through the material (and thus through the filter manufactured from the material) could be made through a process in which ambient pressure (i.e., compression for Teflon) and temperature are carefully controlled. Additionally, or alternatively, a material having a large coefficient of expansion, similar to stainless steel, could be used to manufacture filter 610. In an embodiment, filter 610 may be used to extract particles likely to have contaminated the immersion liquid as the immersion liquid interacts with a substrate or substrate table. Additionally, or alternatively, system 600 may incorporate a device to remove molecular fractions from the immersion liquid, which are generated when the liquid is exposed to UV radiation and chemical components from the resists on a substrate.

Examples of filters 610 suitable for use in system 600 include, but are not limited to, particulate contamination filters and chemical filters. Particulate contamination filters may include a cartridge-type filter that removes particulate contamination from the immersion liquid. If needed, more than one particulate contamination filter may be used at different locations along the immersion liquid flow path. Chemical filters may comprise filter columns filled with filter media, such as, activated alumina, silica, or other materials. In an embodiment, suitable chemical filters may function similarly to recycle columns used in chromatography. In an embodiment, chemical filters can remove residue generated by chemical breakdown of immersion liquids (especially organic immersion liquids) induced by UV radiation.

In an embodiment, temperature controller 612 is used to control a temperature of the immersion liquid. Temperature controller 612 may include a heat exchanger. Since an index of refraction of the immersion liquid is affected by temperature, and a change in index affects the performance of the lithographic system (e.g. calibrated focus may be altered, undesirable aberrations may occur, etc.), temperature control is desirable for the operation of system 600. Heat exchangers and/or control units may be utilized in system 600 at different locations to deliver the range of temperature control needed.

In an embodiment, sparger 616 may be used to remove oxygen and/or water from the liquid. As discussed above, the UV absorbency of the immersion liquid may be maintained by substantially removing oxygen from the immersion liquid through bubbling a replacement sparging gas through the immersion liquid. Suitable sparging gases include, but are not limited to, nitrogen ($N_2$), helium (He), hydrogen ($H_2$), or other gas that exhibits chemical inertness with respect to the immersion liquid. In an embodiment, another method of sparging or degassing may be incorporated into system 600 without departing from the spirit or scope of the present invention.

In an embodiment, degasser 614 can reduce dissolved gas (e.g., dissolved oxygen and/or dissolved sparging gas that replaces oxygen) from the immersion liquid. Degasser 614 can be constructed from materials and under limitations similar to those of filter 610. Additionally, or alternatively, degasser 614 may be constructed from a material having nano-scale pores, which are permeable to the dissolved gas, but not to the immersion liquid. A surface of such a material would have a low surface energy, or the liquid relative to such a surface would have a high contact angle (i.e., the liquid would be lyophobic or oleophobic, for oil-based liquids). In an embodiment, degasser 614 may be used to remove any gas that has combined with the immersion liquid as it passes through the immersion lithography system. Degasser 614 may include a chemical-based membrane.

System 600 further includes a pump 620, configured to drive and circulate the immersion liquid. The pump may have a corresponding safety controller 622. Pump 620 may be constructed from material compatible with the immersion liquid, including, but not limited to, Teflon and stainless steel. Further, pump 620 is manufactured and operated in a way such that additional contamination is not introduced in the immersion liquid. In an embodiment, pump 620 may be free of moving parts so as to be substantially free of lubricant. For example, pump 620 may be a bladder-type pump with no moving parts.

In general, pump 620, or any additional component of system 600, should be operated in a manner that avoids damaging the immersion liquid. For example, bubbles sometimes collect in a liquid line, thereby clogging the flow through the line. Such two-phase flow is undesirable. A pressure can be applied thorough the line to reduce and/or substantially eliminate bubble clogging.

In FIG. 6, components of system 600 are interconnected using connectors (e.g., tubings) formed of a material compatible with the immersion liquid. For example, suitable tubing materials include, but are not limited to, Teflon, Teflon derivatives, KEL-F polychlorotrifluorethyene, glass, and various ceramics.

Various flow controllers or valves 624 that control or stop the flow of liquid or gas are located throughout system 600. For example, system 600 has one or more sensors, meters, or controllers, as discussed above and below (which may not be specifically shown in FIG. 6), and valves 624, which may be used for automatic control of the flow of liquid and gas in system 600.

In an embodiment, system 600 may include an electronic control system 670 for regulation of immersion liquid, as would be understood by one skilled in the art. For example, electronic control system 670 may receive and process signals from one or more components within system 600, and produce or generate either indicative outputs or control signals based thereon. This can be done to alert operators of the conditions of system 600 or to control one or more components of system 600.

System 600 can incorporate metrology-based recycle logic to determine routing of immersion liquid, as will be discussed below with reference to FIG. 7.

In an embodiment as shown in FIG. 6, immersion liquid deemed unsuitable for in-situ reconditioning (e.g., as determined by metrology) is routed to output storage 618, which acts as a holding area for spent immersion liquid. In an embodiment, unusable spent immersion liquid may be captured in output receptacle 628. Alternatively or additionally, the immersion liquid may be routed out to a vendor for major reconditioning, as will be discussed further with reference to FIG. 8.

In various embodiments, additional or alternate components may be incorporated into system 600 without departing from the sprit and scope of the present invention. Various components depicted in FIG. 6 as being separate may be combined in some applications. Components and modules can be duplicated as required along the immersion liquid flow path for better control of re-circulation, as well as for ease of maintenance.

In an embodiment, a liquid is passed from buffer storage 604 of system 600 to pump 620 and safety controller 622 before being received at sparger 616. After being processed by sparger 616, the liquid is passed through the degasser 614, temperature controller 612, and filter 610 before being received by absorption meter 608. From absorption meter 608, the liquid is transmitted through flow cell 606 to the immersion system liquid handling structure (not shown) and optionally to receptacle 626. Liquid can be passed from input storage 602 to the buffer storage 604 and/or liquid can be passed from the immersion system liquid handling structure to buffer storage 604 (and thus be re-circulated).

New immersion liquid is conditioned by recycling system 685 for temperature and purity, and system 600 takes in fresh liquid to replenish liquid loss. System 600 is able to expel liquid in order to maintain the re-circulating liquid with the required specifications.

In an embodiment, a volumetric flow rate for the immersion liquid can be about 500 ml/minute. In additional embodiments, volumetric flow rates for the immersion liquid include, but are not limited to, about 1.5 liters/minute, about 5 liters/minute, and about 10 liters/minute.

Additionally, or alternatively, system 600 may be compatible with flammable, combustible, or inert immersion liquids.

Additionally, or alternatively, units of system 600 can be connected in series or in parallel. For example, such exemplary connections are described in U.S. Patent Application Publication No. US 2008-0062393, which is incorporated by reference herein in its entirety.

In an embodiment, the use of system 600 in a lithographic tool may reduce liquid costs, and further, the use of system 600 may represent a key cost reduction. The system 600 may allow for precise control of immersion liquid parameters, such as a temperature, UV absorption, and refractive index. System 600 can be integrated as a module into an existing immersion system.

Various arrows throughout FIG. 6 illustrate an exemplary flow path for recycling of the immersion liquid.

In an embodiment, the apparatus of this and other embodiments may be part of a closed system or a partially-closed system. Such an embodiment is in contrast to an open system in which immersion liquid, which is removed from the lithographic apparatus, is either disposed or reworked offline and later re-supplied to the lithographic apparatus. In a closed system the liquid in the apparatus is continually recycled, and liquid is not replenished in use with fresh liquid.

FIG. 7 schematically depicts an exemplary immersion liquid handling structure with a metrology device and recycling logic module, according to an embodiment of the present invention. In FIG. 7, an immersion liquid re-circulating system 700 includes a metrology device 750 that is coupled to a recycling control device 775. Metrology device 750 regulates a routing of the immersion liquid based on measurement of various parameters of the immersion liquid performed by the metrology device 750.

System 700 includes a number of components similar to those described above in reference to system 600 in FIG. 6. For example, system 700 includes a gas inlet 601, an input reservoir 704 with a sparger (not shown), which may be identical to either of input storage 602 or buffer storage 604, a temperature controller 612, a degasser 614, a pump 620, and valves 624. Reconditioning unit 785 in system 700 may be identical or similar to reconditioning unit 685 shown in FIG. 6. Alternatively, reconditioning unit 785 may include only one or more filters 610, and/or a temperature controller 612, sparger 616, and/or degasser 614.

Metrology device 750 may include various metrology devices that monitor and control parameters of the immersion liquid that are desirable for the operation of the immersion lithographic apparatus. Metrology device 750 may include a temperature gauge 760 that measures a temperature of the immersion liquid, a flow meter 770 that measures flow rate of the immersion liquid, and an absorption monitoring device 765 that monitors or measures an index of absorption of radiation at a desired wavelength of the immersion liquid. In an embodiment, the absorption monitoring device is configured to monitor an index of absorption of radiation through the immersion liquid and may be a spectrophotometer 765 that measures a UV absorption index of the immersion liquid. Additional metrology components not specifically shown in FIG. 7 include, but are not limited to, a particle counter, a refractive index meter, a gas content meter (e.g., an oxygen content meter), and various readouts to communicate results of metrology (e.g., a refractive index readout, a UV absorption index readout, or a flow rate readout). In an embodiment, flow cell 606 and absorption meter 608, as depicted in FIG. 6, may be included in metrology device 750. Safety controller 622 of FIG. 6 may be included in metrology device 750.

In an embodiment, metrology components may be duplicated within system 700 to provide better regulation of immersion liquid properties.

Recycling control device 775 can include embedded or programmable recycle logic that is used to produce control signals for controlling routing of immersion liquid to either be reused by the liquid handling structure or to be recycled. The recycling control device 775 is connected to the liquid handling structure in the direction of the arrow present in device 775 shown in FIG. 7. Based on metrology results, if recycling control device 775 logically determines that the quality of the immersion liquid is not suitable for use in immersion lithographic operation, then the immersion liquid is not routed to the liquid handling structure. In such an embodiment, the immersion liquid is routed for further reconditioning within system 700 (e.g., by reconditioning unit 785 and then supplied to input reservoir 704), routed out from system 700 to a drain for disposal, or routed to a vendor for major reconditioning, depending on the degree of degradation of the immersion liquid. The recycle control device 775 is connected to a drain which is shown to the right of the recycling control device 775 in FIG. 7. If the recycling control device 775 logically determines that the quality of the immersion liquid is suitable for the immersion lithographic operation, then the immersion liquid is routed to the liquid handling structure. After use by the liquid handling structure, the immersion liquid flows from the liquid handling structure. Optionally, another metrology and/or recycle logic module 780 may be incorporated in the path of the immersion liquid that is flowing from the liquid handling structure, which determines further routing of the immersion liquid to reconditioning unit 785 (and then on to input reservoir 704) or to pump 620 via input reservoir 704. The module 780 is in the flow of immersion liquid from the liquid handling structure into the system 700.

As discussed above with reference to FIG. 6, system 700 may have other components not shown in FIG. 7. A location and a sequence of individual components of system 700 may be changed without departing from the spirit or scope of the invention.

Transparency (related to the index of absorption) of the immersion liquid is very desirable for the control of thermal effect and radiation dose uniformity in an immersion lithographic apparatus. When the quality of the immersion liquid degrades below a certain quality threshold because of repeated regular doses of UV exposure (as the immersion liquid is recycled) or accidental UV overexposure, the degraded high-absorbency portion of the used immersion liquid should be removed and replaced with fresh immersion liquid. Removal of high-absorbency portion of the immersion liquid helps ensure longer reusability of the rest of the recycled immersion liquid.

Figure 8:
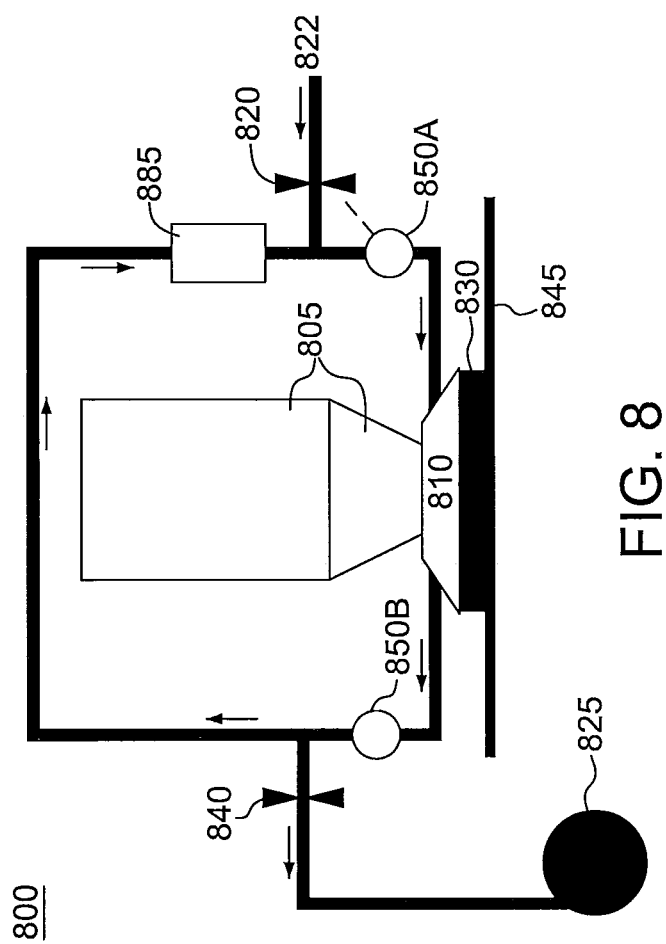
FIG. 8 depicts an exemplary immersion liquid handling structure incorporating a system to control absorbency of the immersion liquid, according to an embodiment of the present invention.

FIG. 8 schematically depicts an exemplary immersion liquid handling structure incorporating a system to control absorbency of the immersion liquid, according to an embodiment of the present invention. In FIG. 8, a recycling system 800 includes a first reconditioning unit 885, metrology devices 850A and 850B, a second reconditioning unit 825, an injection control valve 820, and a drain-off control valve 840. In an embodiment, first reconditioning unit 885 may recondition immersion liquid of a higher quality than that reconditioned by second reconditioning unit 825 (e.g., the first reconditioning unit can recondition liquid to an acceptable level in a longer time than the second reconditioning unit). For example, first reconditioning unit 885 may be selected for reconditioning liquid that is less contaminated than second reconditioning unit 825, because a reconditioning unit can become contaminated by the liquid it is reconditioning. By preventing the higher contaminated liquid from being reconditioned by second reconditioning unit 825, first reconditioning unit 885 can recondition liquid to a higher quality for longer than if just one reconditioning unit were to recondition the immersion liquid.

In FIG. 8, a liquid handling structure 810 is coupled to or positioned adjacent an end portion or a last optical element of a projection optics system 805 in a lithographic apparatus. The presence of a film of high-refractive-index immersion liquid 830 between liquid handling structure 810 and a substrate 845 (mounted on a substrate table) enables projection optics system 805 to achieve a high numerical aperture. For example, a numerical aperture of about 1.55 can be obtained if the immersion liquid has a refractive index higher than conventionally used ultra-pure water. Further, for example, water may limit the numerical aperture to a highest possible value of about 1.35. The liquid handling structure 810 is connected to a drain which is shown by the arrow to the right of the liquid handling structure of FIG. 9.

System 800 is a simplified schematic of a recycling system that enables a continuous feed of new immersion liquid. In an embodiment, system 800 may enable continuous dumping of used immersion liquid. System 800 thereby helps maintain a substantially constant value of radiation absorbency of the immersion liquid. For example, it is desirable to maintain an optical density (i.e., an index based on the absorbency) value of about 0.08/cm for the immersion liquid under the liquid handling structure. As the optical density of the immersion liquid increases beyond about 0.08/cm, fresh immersion liquid with optical density value of about 0.03/cm or lower can be introduced into the liquid flow. Simultaneously, a high-absorbency portion of the immersion liquid can be removed. Injection control valve 820 regulates the inflow of fresh immersion liquid. Drain-off control valve 840 regulates the outflow of undesirable high-absorbency immersion liquid. As such, the resultant optical density of the re-circulated immersion liquid is maintained close to about 0.08/cm. However, in an embodiment, the optical density values may vary within a range of about 0.01/cm to about 0.15/cm without departing from the spirit or scope of the present invention.

In the embodiment of FIG. 8, metrology device 850A is located upstream of liquid handling structure 810, as described above in reference to metrology device 750 of FIG. 7. Metrology device 850B is located downstream of liquid handling structure 810 to measure properties of the immersion liquid after exposure of substrate 845 has been performed. In an embodiment, metrology device 850A or metrology device 850B may be optional and not included within system 800. Although not shown in FIG. 8, metrology device 850A and/or metrology device 850B may control a recycling control device similar to that depicted in FIG. 7. The recycling control device can route the used immersion liquid flowing from the liquid handling structure to regular liquid reconditioning unit 885 if the quality of the immersion liquid were above a certain quality threshold level. Alternatively or additionally, the recycling control device can route the used immersion liquid flowing from the liquid handling structure to intense liquid reconditioning unit 825 if the quality of the immersion liquid were below a certain quality threshold level. In an embodiment, regular liquid reconditioning unit 885 may be locally integrated to the lithographic apparatus, while intense liquid reconditioning unit 825 may reside remotely at a vendor's site.

Alternatively or additionally, immersion liquid flowing from drain-off control valve 840 may be routed to a more intensive liquid reconditioning loop (not shown). Fresh, high-transparency (i.e., low absorbency) immersion liquid may be supplied by the vendor, or may be supplied from the intensive liquid reconditioning loop. Thus, the operation of the lithographic tool can be maintained at a stable, reproducible point with respect to the high-refractive index immersion liquid properties. Exposure parameters, such as, focus, aberrations, and thermal effects of the lithographic apparatus may remain stable. In contrast to existing solutions, system 800 avoids frequent shutdowns of the lithographic apparatus for maintenance and liquid drain, as a continuous liquid feed is employed.

As discussed earlier with reference to systems 600 and 700, system 800 may have other components not shown in FIG. 8. A location and sequence of individual components in system 800 may be changed without diverting from the scope of the invention.

As discussed above, physical and optical parameters of the immersion liquid may be desired to be substantially constant in order to maintain the performance of the exposure system of the lithographic apparatus. Thus, in-situ measurement and feedback (or feed-forward) correction of liquid parameters may be desirable. Control of immersion liquid parameters cannot be done by immersion liquid vendors, as the liquid properties keep changing during the operation of the lithographic apparatus. By controlling the liquid parameters within the lithographic system, a lifetime of liquid reconditioning components may be extended, and a frequency of lithographic apparatus maintenance may be reduced. By controlling the liquid parameters, a total volume of recycled immersion liquid used within a finite time may be reduced. Thus, smaller input and output storage tanks can be used, thereby reducing the total footprint of the immersion liquid recirculating system integrated with the lithographic apparatus. As such, flexibility in component layout can be achieved. As the volume of immersion liquid handled by the system is lower, potential safety risks are proportionally lowered.

Figure 9:
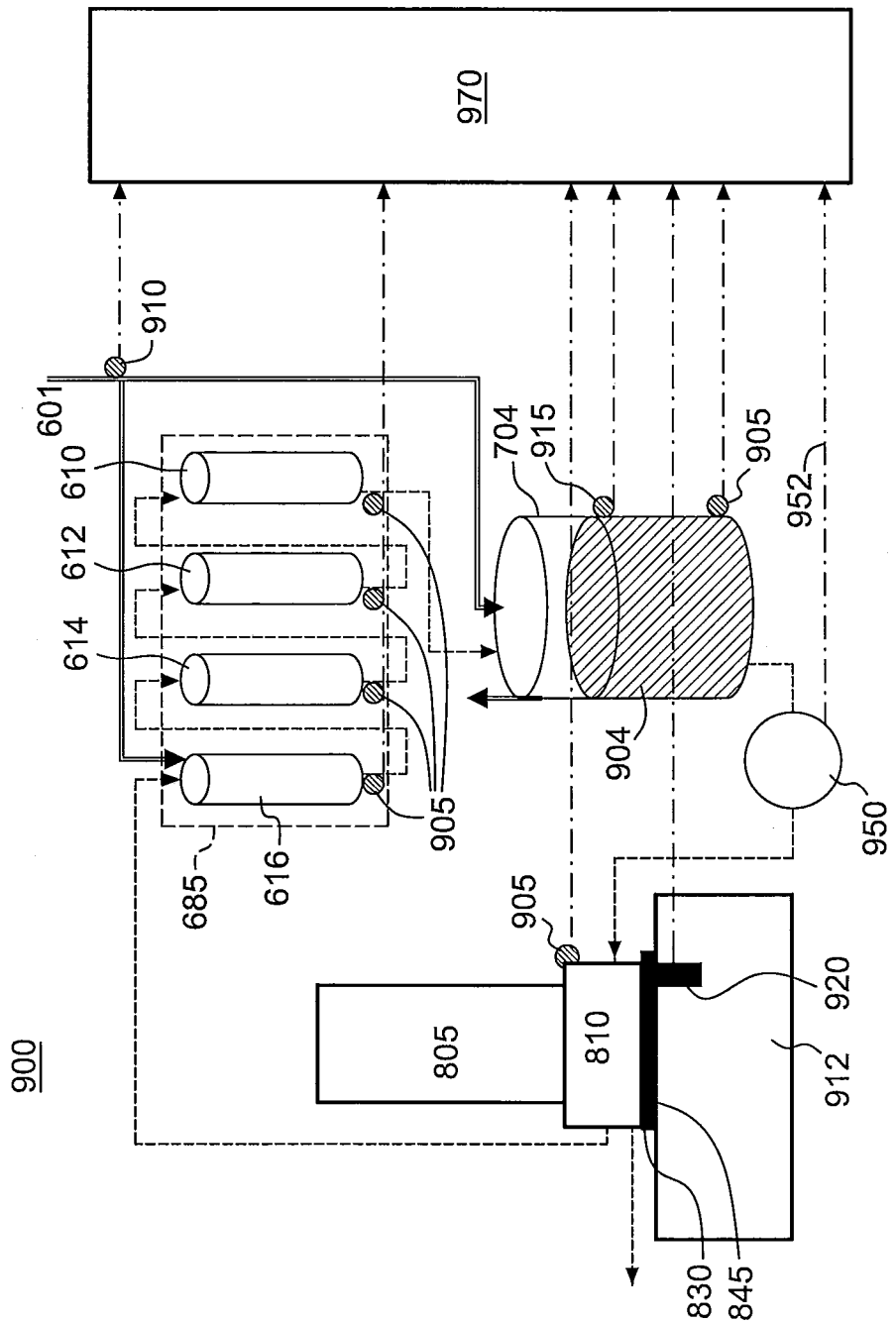
FIG. 9 depicts a control system for immersion liquid recycling in a lithographic apparatus, according to an embodiment of the present invention.

FIG. 9 schematically depicts a control system for immersion liquid recycling in a lithographic apparatus, according to an embodiment of the present invention. In FIG. 9, recirculation system 900 includes a central controller or control system 970 to control the immersion liquid parameters and optionally, lithographic system operational parameters. Many of the components shown in FIG. 9 are similar to components previously shown and described in FIGS. 6, 7, and 8, and like reference numbers indicate like components in FIGS. 6-9.

In FIG. 9, a dotted line indicates a flow path of the immersion liquid. Double solid lines indicate a flow path of a gas, such as, a sparging gas. Thick dash-dot lines indicate communication lines between various sensors and central controller 970. For example, line 952 connects sensors within metrology device 950 to central controller 970.

Exemplary parameters of immersion liquids that can be controlled using system 900 include, but are not limited to, UV-absorbency of the immersion liquid, refractive index of the immersion liquid, surface tension of the immersion liquid, and viscosity of the immersion liquid. A sensor 920 associated with substrate table 912 (which supports substrate 845) collects UV-absorbency and refractive index values from immersion liquid film 830 between liquid handling structure 810 and substrate 845. Metrology device 950 measures viscosity and surface tension of the immersion liquid.

One or more local temperature sensors 905 can be placed on or near various components to monitor temperature of the immersion liquid at different locations. Often local temperature measurement indicates proper or improper operation of a component to which the sensor is associated. For example, when temperature controller 612 malfunctions, a local temperature of the immersion liquid rises. Central controller 970 may then attempt to correct the malfunction using automatic control or notify the probable malfunction to a human operator for manual intervention.

In an embodiment, a level indicator 915, coupled to the controller 970, that is attached to an input reservoir 704 may indicate a level of liquid 904 in input reservoir 704. In this manner, leaks in input reservoir 704 may be detected, and/or immersion liquid refill timing may be determined. The input reservoir 704 may be connected to the gas inlet 601. It is also connected to a gas outlet which is shown in FIG. 9 as vertical arrow at the top of the input reservoir 704.

In an embodiment, a pressure sensor 910, coupled to the controller 970, may monitor inlet gas pressure so that, for example, a desired sparging efficiency is maintained.

As discussed with reference to systems 600, 700, and 800, system 900 may have other components not shown in FIG. 9. A location and sequence of individual components in system 900 may be changed without departing from the scope of the invention.

Figure 10:
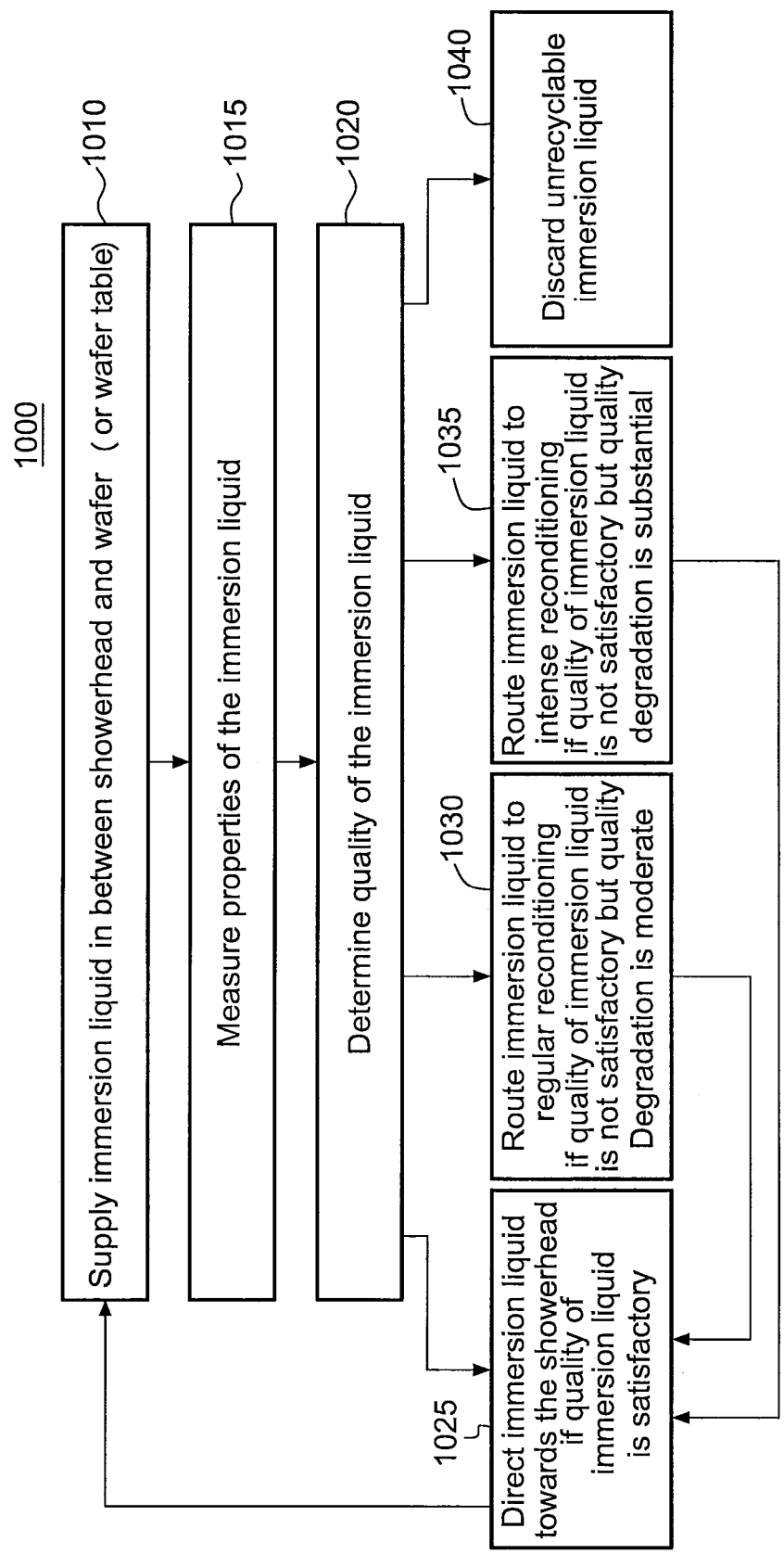
FIG. 10 is a flowchart depicting an exemplary method of immersion liquid recycling, according to an embodiment of the present invention.

FIG. 10 is a flowchart of an exemplary method 1000 of immersion liquid recycling, according to an embodiment of the present invention. For example, method 1000 can be practiced by one or more of the systems described in reference to FIGS. 6-9.

In step 1010, an immersion liquid is supplied between a liquid handling structure and a substrate (or a substrate table). In step 1015, one or more properties of the immersion liquid are measured. Measured properties include, but are not limited to, UV-absorbency, refractive index, viscosity, flow rate, dissolved gas content, particle count, and temperature. In step 1020, a quality of the immersion liquid is determined, based on the measurements performed in step 1015. A logic based module may then compare the measured quality of the immersion liquid against a certain reference quality.

Based on the quality determination step 1020, various alternative steps may follow. For example, if the measured quality of the immersion liquid were deemed satisfactory, then the immersion liquid is directed towards the liquid handling structure for reuse, as depicted in step 1025. Method 1000 then loops back to the first step 1010, i.e., supplying immersion liquid to the liquid handling structure.

Alternatively, step 1020 may determine that measured quality of the immersion liquid is unsatisfactory for direct routing to the liquid handling structure. In such an embodiment, the logic-based module may then determine whether a degradation of the immersion liquid falls within a certain threshold level or beyond a certain threshold level. (e.g., within or beyond a moderate level of degradation). If the degradation of the immersion liquid falls within a moderate level, then the immersion liquid may be routed to a regular reconditioning unit, as shown in step 1030. However, if the degradation of the immersion liquid lies beyond a moderate level, the immersion liquid may be routed to an intense reconditioning unit, as shown in step 1035.

After regular or intense reconditioning in steps 1030 or 1035, the reconditioned immersion liquid may be routed or directed to the liquid handling structure. Such routing or direction is shown by the arrows connecting steps 1030 and 1035 to step 1025.

In an embodiment, the logic-based module may determine that the immersion liquid is substantially degraded and not recyclable. As such, the immersion liquid, or portion thereof, is discarded, as shown in step 1040.

Steps 1010-1040 are described for illustrative purposes only. Method 1000 is neither limited to the steps 1010-1040 only, nor limited by the sequence of the steps. Additional steps, not shown in FIG. 10, may be incorporated into method 1000. Method 1000 does not have to follow every step shown in FIG. 10.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. The substrate may be processed more than once, for example in order to create a multi-layer IC, so that the term substrate used herein may refer to a substrate that already contains multiple processed layers.

The terms "radiation" and "beam" used herein encompass all types of electromagnetic radiation, including ultraviolet (UV) radiation (e.g., having a wavelength of or about 365, 248, 193, 157 or 126 nm) or extreme ultraviolet (EUV) radiation, though certain modifications of the re-circulating systems may be necessary to be suitable for EUV applications.

The term "lens," where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g., semiconductor memory, magnetic or optical disk) having such a computer program stored therein. The machine readable instruction may be embodied in two or more computer programs. The two or more computer programs may be stored on one or more different memories and/or data storage media.

The controllers described above may have any suitable configuration for receiving, processing, and sending signals. For example, each controller may include one or more processors for executing the computer programs that include machine-readable instructions for the methods described above. The controllers may include data storage medium for storing such computer programs, and/or hardware to receive such medium.

One or more embodiments of the invention may be applied to any immersion lithography apparatus, in particular, but not exclusively, those types mentioned above and whether the immersion liquid is provided in the form of a bath, is confined to a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid handling system as contemplated herein should be broadly construed. In certain embodiments, the liquid handling system may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid handling system may optionally further include one or more elements to control the position, quantity, quality, shape, flow rate or any other features of the liquid.

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A lithographic apparatus for immersion lithography, the apparatus comprising:
   a projection system configured to project a patterned radiation beam onto a target portion of a substrate, the substrate being supported on a substrate table;
   a fluid handling system having a fluid handling structure configured to provide an immersion fluid, comprising liquid, to a space between the projection system and the substrate, or the substrate table, or both;
   a metrology device configured to directly monitor a parameter of the immersion fluid; and
   a recycling control device coupled to the metrology device, the recycling control device configured to regulate a routing of the immersion fluid either to be supplied to the space or to be reconditioned, based on an output of the metrology device, and configured to regulate a routing of immersion fluid from the fluid handling structure after use to a regular fluid reconditioning unit to remove solid or liquid material from the immersion fluid or to a separate intense fluid reconditioning unit to remove solid or liquid material from the immersion fluid, based on an output of the metrology device.

2. The lithographic apparatus of claim 1, wherein the immersion fluid is a hydrocarbon.

3. The lithographic apparatus of claim 1, wherein the metrology device is configured to monitor a level of particulate contamination in the immersion fluid.

4. The lithographic apparatus of claim 1, wherein the metrology device comprises one or more devices selected from the following:
   a temperature gauge;
   an absorption monitoring device configured to monitor an index of absorption of radiation at a desired wavelength; or
   a flow meter.

5. The lithographic apparatus of claim 4, wherein the one or more devices comprises the absorption monitoring device and the absorption monitoring device is a spectrophotometer.

6. The lithographic apparatus of claim 4, wherein the metrology device further comprises a gas content measuring device configured to measure gas content of immersion fluid.

7. The lithographic apparatus of claim 4, wherein the metrology device further comprises an output configured to indicate measured values of the parameter of the immersion fluid.

8. The lithographic apparatus of claim 1, wherein the fluid handling system comprises one or more components selected from the following components:
   an input storage tank configured to store immersion fluid;
   a buffer reservoir configured to receive immersion fluid from the space;
   a pump configured to direct immersion fluid towards the fluid handling structure;
   a sparger configured to remove oxygen from immersion fluid;
   a filter configured to remove residues and contaminants from immersion fluid;
   a valve configured to control a flow of immersion fluid;
   a degasser configured to remove unwanted gaseous materials from immersion fluid;
   a temperature controller configured to maintain a desired temperature of immersion fluid;
   an output tank configured to store immersion fluid drained out of the lithographic apparatus; or
   connectors configured to physically connect the components of the fluid handling system.

9. The lithographic apparatus of claim 8, wherein the one or more components of the fluid handling system include a material that does not degrade the immersion fluid.

10. The lithographic apparatus of claim 9, wherein the material comprises Teflon, stainless steel, polychlorotrifluorethyene, and/or glass.

11. The lithographic apparatus of claim 8, wherein the one or more components of the fluid handling system include a material that is chemically compatible with a flammable, combustible, and/or inert immersion fluid.

12. The lithographic apparatus of claim 8, wherein the one or more components of the fluid handling system are substantially free of residues and contaminants introduced during a manufacturing phase.

13. The lithographic apparatus of claim 12, wherein the one or more components of the fluid handling system include a sintered material.

14. The lithographic apparatus of claim 8, wherein the one or more components comprises the input storage tank and the input storage tank comprises a bladder made of a material that is substantially chemically compatible with the immersion fluid.

15. The lithographic apparatus of claim 8, wherein the one or more components comprises the pump and the pump comprises a bladder pump.

16. The lithographic apparatus of claim 8, wherein the one or more components comprises the filter and the filter comprises a particulate contamination removal filter.

17. The lithographic apparatus of claim 8, wherein the one or more components comprises the filter and the filter comprises a chemical contamination removal filter.

18. The lithographic apparatus of claim 8, wherein the one or more components comprises the degasser and the degasser comprises nano-scale pores configured to selectively pass gaseous materials, to substantially block the immersion fluid, and to substantially separate the immersion fluid and the gaseous materials.

19. The lithographic apparatus of claim 8, wherein the one or more components of the fluid handling system are connected in series.

20. The lithographic apparatus of claim 8, wherein the one or more components of the fluid handling system are connected in parallel.

21. A fluid handling system for use in a lithographic apparatus, the fluid handling system comprising:
   a metrology device configured to directly monitor a parameter of an immersion fluid, comprising liquid, wherein a quality of the immersion fluid is determined before directing the immersion fluid to a fluid handling structure of the lithographic apparatus; and
   a recycling control device, coupled to the metrology device, configured to regulate a routing of immersion fluid from the fluid handling structure after use to a regular reconditioning unit to remove solid or liquid material from the immersion fluid or a separate intense fluid reconditioning unit to remove solid or liquid material from the immersion fluid, based on the determined quality of the immersion fluid.

22. The fluid handling system of claim 21, wherein the recycling control device is configured to route used immersion fluid from the space to the regular fluid reconditioning unit if the quality of the immersion fluid is above a quality threshold level.

23. The fluid handling system of claim 21, wherein the recycling control device is configured to route used immersion fluid from the space to the intense fluid reconditioning unit if the quality of the immersion fluid is below a quality threshold level.

24. A control system for maintaining a desired quality of an immersion fluid, comprising liquid, in a lithographic apparatus, the control system comprising:
   a metrology device configured to directly monitor a parameter of the immersion fluid, the metrology device comprising a sensor in or on a movable table of the lithographic apparatus; and
   a recycling control device coupled to the metrology device, the recycling control device configured to regulate a routing of the immersion fluid either to be supplied to a space between a projection system and a substrate, or a substrate table, or both, of the lithographic apparatus or to be reconditioned based on an output of the metrology device, and configured to regulate a routing of immersion fluid from the space after use to a regular fluid reconditioning unit to remove solid or liquid material from the immersion fluid or to a separate intense fluid reconditioning unit to remove solid or liquid material from the immersion fluid, based on an output of the metrology device.

25. The control system of claim 24, further comprising:
   a fluid level indicator configured to allow the control system to determine whether a fluid reservoir needs to be replenished.

26. The control system of claim 24, further comprising:
   a pressure sensor configured to allow the control system to determine whether a pressure level needs to be adjusted.

27. A device manufacturing method, comprising:
   providing an immersion fluid, comprising liquid, from a fluid handling structure to a space between a projection system and a substrate, or a table, or both, wherein the projection system is configured to project a patterned radiation beam onto a target portion of the substrate;
   directly monitoring a parameter of the immersion fluid using a metrology device;
   regulating a routing of the immersion fluid either to the space or to be reconditioned based on an output of the metrology device; and regulating a routing of immersion fluid from the fluid handling structure after use to a regular fluid reconditioning unit to remove solid or liquid material from the immersion fluid or to a separate intense fluid reconditioning unit to remove solid or liquid material from the immersion fluid, based on an output of the metrology device.

28. The method of claim 27, wherein the providing step further comprises:
using a fluid handling system, wherein one or more components of the fluid handling system are manufactured by a method that is unlikely to introduce substantial unwanted residues and contaminants that can affect properties of the immersion fluid.

* * * * *